(12) United States Patent
Wyrebek et al.

(10) Patent No.: US 11,999,883 B2
(45) Date of Patent: Jun. 4, 2024

(54) LIGHTWEIGHT RF SHIELDING CONDUCTIVE ELASTOMERIC TAPE

(71) Applicant: SWIFT TEXTILE METALIZING LLC, Bloomfield, CT (US)

(72) Inventors: Bryan T. Wyrebek, Bristol, CT (US); Alexander T. Smith, Simsbury, CT (US); Jared D G Butlin, Longmeadow, MA (US)

(73) Assignee: Swift Textile Metalizing LLC, Bloomfield, CT (US)

( * ) Notice: Subject to any disclaimer, the term of this patent is extended or adjusted under 35 U.S.C. 154(b) by 0 days.

(21) Appl. No.: 16/503,824

(22) Filed: Jul. 5, 2019

(65) Prior Publication Data

US 2020/0010739 A1 Jan. 9, 2020

Related U.S. Application Data

(60) Provisional application No. 62/694,606, filed on Jul. 6, 2018.

(51) Int. Cl.
  *C09J 9/02* (2006.01)
  *B32B 5/02* (2006.01)
  (Continued)

(52) U.S. Cl.
  CPC ............... *C09J 9/02* (2013.01); *B32B 5/024* (2013.01); *C09J 7/29* (2018.01); *C09J 7/38* (2018.01); *C09J 11/04* (2013.01); *H05K 9/0081* (2013.01); *B32B 2274/00* (2013.01); *B32B 2307/202* (2013.01); *B32B 2307/212* (2013.01); *B32B 2405/00* (2013.01); *B32B 2605/18* (2013.01); *C09J 2203/326* (2013.01); *C09J 2400/123* (2013.01); *C09J 2400/163* (2013.01);
  (Continued)

(58) Field of Classification Search
  CPC ...... C09J 9/02; B32B 27/08; B32B 2307/212; B32B 2605/18; B32B 2250/40; B32B 2307/202; B32B 2405/00; B32B 5/024; B32B 2274/00
  See application file for complete search history.

(56) References Cited

U.S. PATENT DOCUMENTS

| | | | |
|---|---|---|---|
| 6,337,294 B1 * | 1/2002 | Waldrop, III | B32B 7/12 442/317 |
| 2003/0091777 A1 * | 5/2003 | Jones | C09J 7/38 428/40.1 |

(Continued)

OTHER PUBLICATIONS

"Measuring EMI Shielding Effectiveness", 2012, https://www.thomasnet.com/articles/automation-electronics/effective-emi-shielding/ (Year: 2012).*

(Continued)

*Primary Examiner* — Jasper Saberi
(74) *Attorney, Agent, or Firm* — Baker & McKenzie LLP

(57) ABSTRACT

A lightweight electromagnetic wave shielding tape is disclosed. The tape includes a first polymer protective layer, a calendered conductive material layer coupled to a bottom side of the first polymer protective layer, and a second polymer protective layer coupled to a bottom side of the conductive material layer so that the conductive material layer is encapsulated within the protective layers. An adhesive layer can also be applied to one of the protective layers.

24 Claims, 8 Drawing Sheets

(51) Int. Cl.
*C09J 7/29* (2018.01)
*C09J 7/38* (2018.01)
*C09J 11/04* (2006.01)
*H05K 9/00* (2006.01)

(52) U.S. Cl.
CPC .... *C09J 2423/046* (2013.01); *C09J 2423/106* (2013.01); *C09J 2433/006* (2013.01); *C09J 2463/006* (2013.01); *C09J 2475/006* (2013.01); *C09J 2477/006* (2013.01); *C09J 2483/006* (2013.01)

(56) References Cited

U.S. PATENT DOCUMENTS

| | | | | |
|---|---|---|---|---|
| 2005/0062024 | A1* | 3/2005 | Bessette | C09J 7/38 252/500 |
| 2007/0011693 | A1* | 1/2007 | Creasy | C08K 5/49 720/650 |
| 2008/0057191 | A1* | 3/2008 | Chang | C23C 18/2013 427/314 |
| 2009/0117322 | A1* | 5/2009 | Larsen | B32B 33/00 428/137 |
| 2010/0190111 | A1* | 7/2010 | Ichiki | H05K 3/22 430/311 |
| 2012/0126381 | A1* | 5/2012 | Uenda | H01L 23/552 257/659 |
| 2015/0086743 | A1* | 3/2015 | Lee | B32B 5/26 428/41.8 |
| 2016/0257394 | A1* | 9/2016 | Gleason | B32B 27/12 |
| 2016/0312074 | A1* | 10/2016 | Choi | C09J 7/22 |
| 2019/0316008 | A1* | 10/2019 | Choi | C09J 7/20 |

OTHER PUBLICATIONS

"PVDF", 2020, Curbell Plastics, https://www.curbellplastics.com/Research-Solutions/Materials/PVDF (Year: 2020).*

"Everything You Need To Know About Nylon", 2016, Creative Mechanisms, https://www.creativemechanisms.com/blog/3d-printing-injection-molding-cnc-nylon-plastic-pa (Year: 2016).*

"Ripstop Fabric By The Yard", Fabric Wholesale Direct (FWD), 2022, https://www.fabricwholesaledirect.com/collections/ripstop-fabric (Year: 2022).*

* cited by examiner

LIGHTWEIGHT RF SHIELDING CONDUCTIVE ELASTOMERIC TAPE

CROSS REFERENCE TO RELATED APPLICATION

The present application claims priority to U.S. Provisional Application No. 62/694,606 filed on Jul. 6, 2018, the entire contents of which is incorporated herein for all purposes by this reference.

BACKGROUND

Electronic devices has proliferated in the world, making increased radio frequency interference a major concern. Such interference arise when magnetic and electrical energy emitted by electronic devices unintentionally interact with one another, potentially causing the devices to malfunction.

Conductive elastomeric tapes are frequently used to provide shielding against electromagnetic waves. Such shielding is helpful, for example, in the aerospace market, where conductive elastomeric tapes may be used as ground plane for aircraft.

Conventional tapes provide good radio frequency electromagnetic interference shielding (RF shielding). The tapes generally include a conductive layer including conductive material to block the interfering waves. However, they are relatively heavy and contribute an appreciable amount of weight that impact the performance and longevity of the intended system. For example, the layers of the elastomeric tapes as applied on an aircraft would impact the total life cycle of the aircraft because a significant additional amount of fuel must be used to account for carrying the elastomeric tapes.

As discussed above, there is a growing need for lighter weight conductive elastomeric tapes that reduce the total weight of an aircraft due to the high cost of fuel. Any reduction in weight of the conductive elastomeric tape can increase the fuel efficiency of an aircraft and reduce the life cycle fuel cost.

BRIEF SUMMARY

The present disclosure relates to a new lightweight radio frequency (RF) shielding conductive elastomeric tape. In an embodiment, the conductive elastomeric tape includes a first polymer protective layer, a conductive material layer coupled to a bottom side of the first polymer protective layer, and a second polymer protective layer coupled to a bottom side of the conductive material layer. In an embodiment, the conductive layer is calendered using a calender apparatus. In an embodiment, the conductive elastomeric tape includes an adhesive layer. The calendered conductive layer may be made from a number of conductive material, providing light weight and high level of shielding.

DETAILED DESCRIPTION

Embodiments of a conductive elastomeric tape and methods for producing a conductive elastomeric tape are described. It is to be understood, however, that the following explanation is merely exemplary in describing the devices and methods of the present disclosure. Accordingly, any number of reasonable and foreseeable modifications, changes, and/or substitutions is contemplated without departing from the spirit and scope of the present disclosure.

Figure 1:
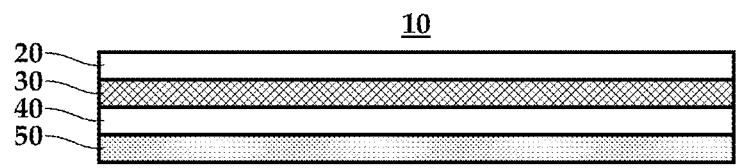
FIG. 1 shows a cross-sectional view of an embodiment of the new lightweight and RF shielding conductive elastomeric tape.

FIG. 1 shows an embodiment of a conductive elastomeric tape 10 according to the present disclosure. The conductive elastomeric tape 10 may include a protective coating layer 20. The protective coating layer 20 may be fabricated from one of a number of different types of polymers. For example, the polymer of the protective coating 20 may be thermoplastic, thermoset, thermoplastic elastomer, elastomer, or ionomer. More specifically, the polymer of the protective coating 20 may be epoxies, RTV silicone, peroxide cured silicone, platinum cured silicone, thermoset polyurethane, UV cured polyurethane thermoplastic polyurethane, polypropylene, polyethylene, nylon 6, nylon 66, ethylene (meth) acrylic acid, polyamides, or co-polymers thereof. The polymer coating may also include an optional filling material that can be conductive or non-conductive. Possible materials that may be used as filling material can be any of, but not limited to, multi wall carbon nanotube, single wall carbon nanotubes, high aspect ratio carbon nanotubes, graphene, reduced graphene oxide, graphite, silver coated graphite, nickel coated graphite, copper coated graphite, gold coated graphite, magnetically permeable materials, ferrites, iron powder, copper powder, nickel powder, silver powder, and alloys thereof. Fillers can be in flake, sphere, or rod morphology. The material properties of the selected protective layer can provide chemical resistance to solvents, as well as temperature degradation resistance and environmental corrosion resistance.

The conductive elastomeric tape 10 further includes a conductive material layer 30. This conductive material layer 30 may also be called a shielding layer, and is made up of a base material and a conductive material. Possible materials that may be used as base material include elastomers, thermoplastic polymers, cellulose fiber, carbon, fiberglass, composites, thermoset polymers, and basalt. Specific examples of base material include nylon 6, nylon 66, polyester, polyethylene, polyurethane, viton, and carbon fiber. Possible materials that may be used as conductive material include any of intrinsically conductive polymers, metals, carbon, and metal oxides. Specific examples of conductive materials include polyaniline, graphene, carbon nanotubes, silver, nickel, and copper. Different combinations of base materials and conductive materials can change the product performance to target shielding attenuations for various frequency ranges. Different base materials may also provide different mechanical advantages, such as, higher tensile strength, elongation and temperature degradation resistance, etc. Depending on the material used, the conductive material is capable of shielding to an RF attenuation of 0-120 dB within a frequency range of 1 KHz-100 GHz.

The conductive elastomeric tape 10 may further include a protective coating 40. The protective coating 40 may include the same or similar composition as protective coating 20, and may be made from a polymer including thermoplastic, thermoset, thermoplastic elastomer, elastomer, or ionomer material. Even more specifically, the protective coating 40 may be epoxies, RTV silicone, peroxide cured silicone, platinum cured silicone, thermoset polyurethane, UV cured polyurethane thermoplastic polyurethane, polypropylene, polyethylene, nylon 6, nylon 66, ethylene (meth)acrylic acid, polyamides, or co-polymers thereof. Protective coating 40 also can include optional filling material, as discussed in relation to protective coating 20 above.

As shown in FIG. 1, protective coating 20 and protective coating 40 are respectively attached to the top and bottom sides of the conductive material layer 30. In this way, the conductive material layer 30 is encapsulated within protective coatings 20 and 40 so as to be able to achieve a longer product life cycle. The protective coatings 20 and 40 increase durability of the lightweight RF shielding conductive elastomer tape 10. Specifically, the protective coating 20 and 40 provide barriers between the conductive material layer 30 and chemical solvents, corrosives, etc. that would degrade the conductive material layer 30, as well as barriers from environmental exposure to salt fog, humidity, temperature, etc. The protective coating 40 further provides a barrier between the conductive material 30 and an adhesive layer 50 to be discussed below. The mechanical advantages of the protective coating are increased tensile strength, elongation and tear resistance. These mechanical performance increases also benefit the product life cycle from a durability standpoint. Finally, the protective coatings 20 and 40 also can serve as dielectric insulation.

The conductive elastomeric tape 10 may further include an adhesive layer 50. As shown in FIG. 1, the adhesive layer 50 may be coupled to a bottom side of the protective coating 40. In other embodiments of the invention, an adhesive layer (not shown) may also be coupled to the top side of the polymer protective coating 20 so that the conductive elastomeric tape 10 becomes a double sided tape. The adhesive layer is optional, and in other embodiments of the invention, no such layer is attached to either the protective coating layer 20 or layer 40. In the current disclosed embodiment, the adhesive layer 50 may be a pressure sensitive, in situ polymerized, RTV, UV cured, thermoplastic, multi-component, contact, thermoset, or high energy cure adhesive layer. Specific examples of the adhesive used to fabricate the adhesive layer 50 may include acrylic, rubber cement, polyurethane, epoxy, and silicone based adhesives.

Figure 2:
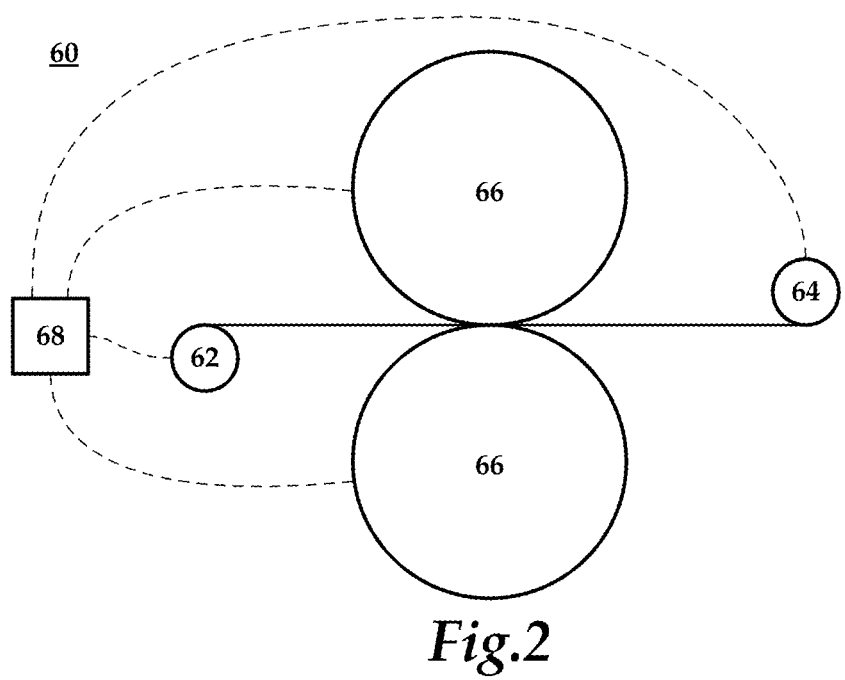
FIG. 2 shows a calendering apparatus by which a conductive layer may be manufactured from conductive material.

FIG. 2 discloses a calendering apparatus 60 by which the conductive material layer 30 of the elastomeric tape 10 may be manufactured. Calendering is a process where a metal substrate is compressed into smaller thickness. To manufacture the elastomeric tape 10 shown in FIG. 1, conductive material 32 that will become the conductive material layer 30 is put through the calendering apparatus 60. The calendering apparatus 60 includes an unwind roller 62 and a rewind roller 64. During operation, conductive material 32 is fed from the unwind end of the calendering apparatus 60 from the unwind roller 62, through the calendering rollers 66, and rewound at the end of the calendering apparatus 60 at the rewind roller 64. The rollers can be made of, but not limited to, ceramic, metal, and rubber materials.

A control mechanism 68 may be used to control the operation parameters of the calendering apparatus 60. For example, the control mechanism 68 may control the operating speeds of each rollers individually so that the rollers 62, 64 and 66 may be operated in different speeds as needed. In addition, the control mechanism may control a nip pressure, which is the pressure exerted by the calendering rollers 66 onto the conductive material 32. The control mechanism 68 may further include a heating control mechanism to control the temperature of the rollers either individually or altogether. The control mechanism 68 may further control other operation parameters of each roller 62, 64 and 66. Exemplary operating parameter range for the calendering apparatus is shown in table 1 below:

TABLE 1

| Controlled nip pressure | 0.001 to 1000 tons |
| Line speed control | 1 to 1000 linear yards/min |
| Tension control | 0.1 to 100 lbs |
| Roll temperature | 0 to 600° F. |

To reiterate the disclosure of Table 1, the calendering apparatus 60 may control the calendering rollers 66 to exert a nip pressure between 0.001 to 1000 tons. The rollers 62, 64 and 66 may further be controlled so that the conductive material 32 may travel between 1 to 1000 yards per minute. The rollers 62, 64 and 66 may further be controlled so that the conductive material 32 has a tension between 0.1 to 100 pounds. The rollers 62, 64 and 66 may further be controlled to have a temperature of between 0 to 600 degrees Fahrenheit.

Since the conductive material 32 can vary in construction and composition, the degree to which calendering is beneficial will be dependent on the material of the conductive base material 32. Just like cold or hot rolling, the conductive material 32 can be passed through the process more than once, if desired. After the material has completed the calendering process, the general benefits that should be observed are as follows: smaller conductive material pore size, smoother surface finish for a better surface conductivity and lower RF surface noise, and increased abrasion resistance. The thinner conductive layer after calendering also allows for less material usage in the protective coating layer, which ultimately drives the overall weight reduction for the product. Roll to roll calendering of the conductive material offers much higher economies of scales versus other similar processes where a substrate is compressed to a smaller thickness. Therefore, roll to roll calendering has a much higher capacity for production volumes and provides the lowest cost of manufacturing.

To further manufacture the elastomeric tape 10, protective coating must be applied onto the calendered conductive material 30, where a constant thickness of polymer is applied throughout the substrate. For example, a protective polymer coating may be applied to the calendered conductive material 30 by either casting, spraying, dipping, molding, or extruding, so that the protective polymer coating thereafter becomes the protective layer 20 and/or 40 as shown in FIG. 1. In a particular embodiment, the total thickness of the combined conductive material layer 30 and protective polymer coating layers 20 and 40 may range between 0.004 to 0.008 inches with the conductive layer ranging from 0.001 to 0.007 inches and the protective coating layers ranging from 0.001 to 0.007 inches. In addition, the adhesive layer 50 may range between 0.001 to 0.003 inches in thickness.

As disclosed above, a reduction of the conductive layer 30 thickness is achieved by the calendering of conductive material 32 to make the conductive material 32 thinner and more conductive with increased RF performance and reduced RF surface noise. The thinner conductive material 32 also reduces the amount of thermosetting protective coating needed because of the reduction in the overall volume the protective coating material needs to fill due to the smaller pore size and thickness in the conductive layer, which ultimately reduces the protective coating and overall thickness and weight of the stack up. Due to the weight reduction in conductive elastomeric tape, all applicable aircraft will see an overall weight reduction and savings on fuel consumption on top of a performance increase. Lastly, the overall thickness reduction in the conductive layer gives the product more flexibility and stretch ability for easier installment onto any surface.

Figure 3:
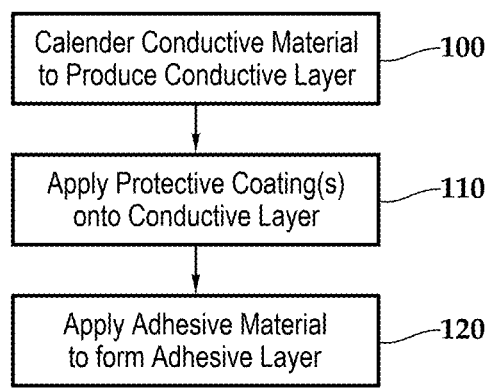
FIG. 3 shows a method of manufacturing a conductive elastomeric tape.

FIG. 3 discloses an exemplary process of manufacturing the conductive elastomeric tape of the instant disclosure. At process 100, conductive material 32 is calendered to produce conductive layer 30 as discussed above in relation to FIGS. 1-2. Process 100 may be repeated until the output conductive layer 30 achieves an appropriate desired property (e.g. weight, thickness, conductivity, etc.). At process 110, protective coating may be applied onto the conductive layer 30. As shown in FIG. 1, protective coating 20 and 40 is applied onto the top and bottom of the conductive layer 30. At process 120, adhesive material may be optionally applied so create an adhesive layer. As shown in FIG. 1, the adhesive layer 50 is formed on the bottom side of the protective coating 40.

Figure 4:
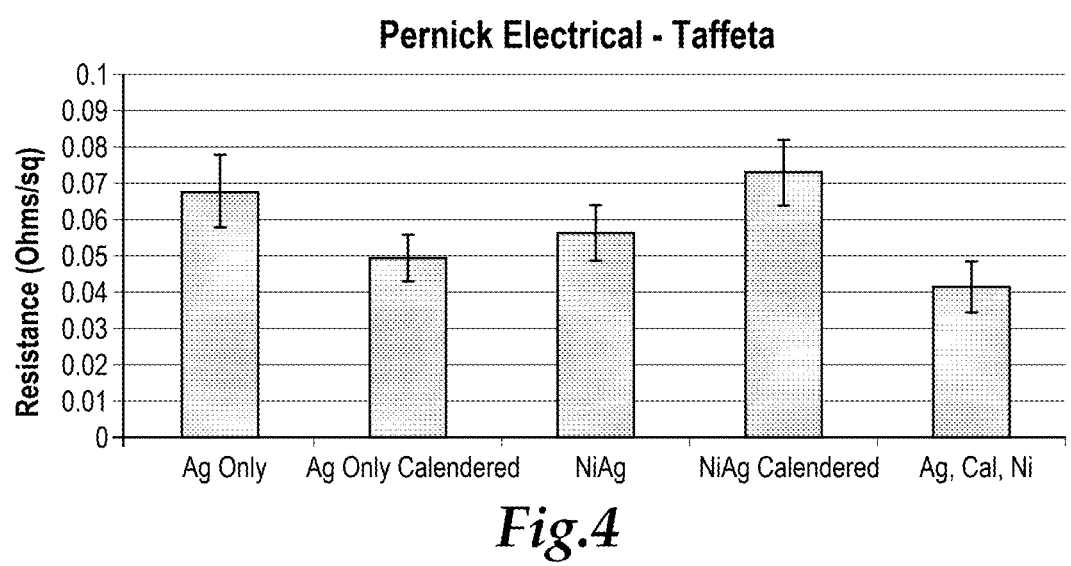
FIG. 4 shows product data of pernick electrical surface resistance for multiple embodiments of the conductive elastomeric tape discussed above.
Figure 5:
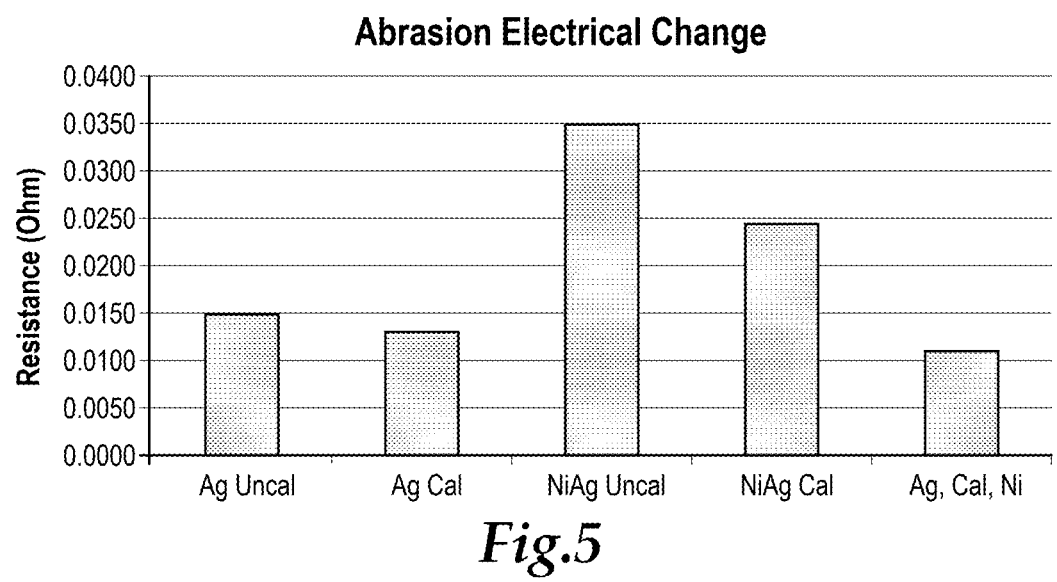
FIG. 5 shows product data of abrasion electrical change for multiple embodiments of the conductive elastomeric tape discussed above.
Figure 6:
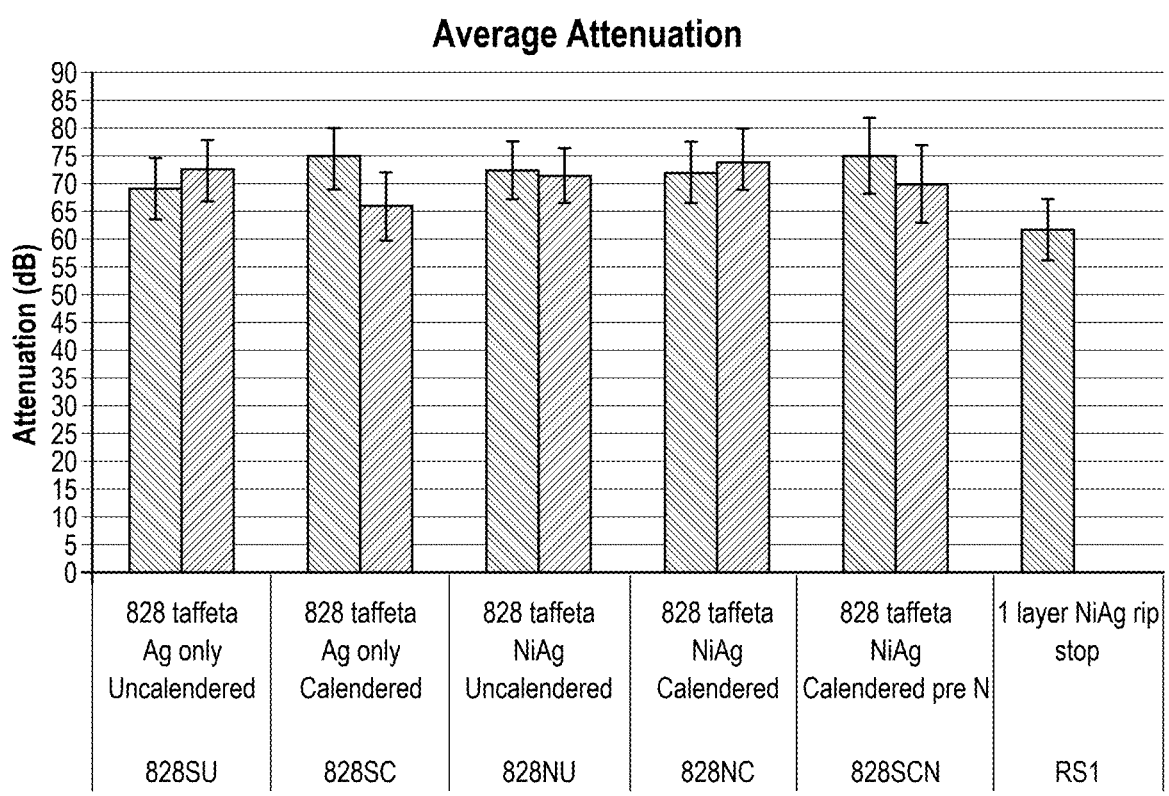
FIG. 6 shows product data of attenuation for multiple embodiments of the conductive elastomeric tape discussed above.

FIGS. 4-6 disclose product data of various embodiments of the conductive elastomeric tape disclosed above. FIG. 4 discloses a Pernick Electrical Surface Resistance—Taffeta chart, which illustrates electrical resistance as a function of the conductive material used for the conductive layer. An electrical resistance is measured in Ohms per square of the respective conductive material. Data for five different sets of conductive material within the conductive layers are provided. For example, for a conductive layer using silver (Ag) as a conductive material whereby the conductive layer was not calendered during the manufacturing process (Ag Only), an electrical resistance is between 0.06 to 0.07 Ohms per square. Comparatively, a conductive layer using silver (Ag) as conductive material where the conductive layer is calendered (Ag Only Calendered) during manufacture has an electrical resistance of approximately 0.05 Ohms per square. Conductive layer using nickel silver (NiAg) as conductive material where the conductive layer was not calendered during the manufacture process has an electrical resistance of between 0.05 to 0.06 Ohms per square. Comparatively, a conductive layer using NiAg as conductive material where the conductive layer is calendered during manufacture (NiAg Calendered) has an electrical resistance between 0.07 to 0.08 Ohms per square. Lastly, an "Ag, Cal, Ni" type conductive layer has an electrical resistance of approximately 0.04 Ohms per square. It should be noted that the NiAg material discussed in reference to FIG. 4 is nickel and silver plated, and the "Ag, Cal, Ni" type conductive layer is produced by calendering a conductive layer having silver as conductive material, and applying a nickel plating to the conductive layer. In an embodiment, a conductive layer including silver as conductive material has an electrical resistance of between 0.001 to 0.1 Ohms per square. In an embodiment, a conductive layer including nickel silver as conducive material has an electrical resistance of 0.001 to 0.1 ohms per square.

FIG. 5 discloses an abrasion electrical change chart, which illustrates electrical resistance change as a function of abrasion and loss of metal of the conductive layer. Data for five different sets of conductive material within the conductive layers are provided. For example, for a conductive layer using silver (Ag) as conductive material whereby the conductive layer was not calendered during the manufacture process (Uncal), an increase in electrical resistance is approximately 0.015 Ohms. Comparatively, a conductive layer using silver (Ag) as conductive material whereby the conductive layer is calendered (Cal) during manufacture has an increase in electrical resistance of approximately 0.0125-0.013 Ohms. Conductive layer using nickel silver (NiAg) as conductive material whereby the conductive layer was not calendered during the manufacture process (Uncal) has an increase in electrical resistance of near 0.0350 Ohms. Comparatively, a conductive layer using NiAg as conductive material whereby the conductive layer is calendered during manufacture has an electrical resistance of close to 0.0240 Ohms. Lastly, an "Ag, Cal, Ni" type conductive layer has an increase in electrical resistance of approximately 0.010 to 0.012 Ohms. It should be noted that the NiAg material discussed in reference to FIG. 5 is nickel and silver plated, and the "Ag, Cal, Ni" type conductive layer is produced by calendering a conductive layer having silver as conductive material, and applying a nickel plating to the conductive layer. This data shows and discloses an evaluation of a particular combination of metals and surface condition for abrasion resistance.

FIG. 6 discloses product data regarding the average EMI/RFI shielding attenuation for different combinations of calendering and metal coatings, each data bar representing a sample product made from the disclosed material. Attenuation measures the effectiveness of interference shielding, and refers to the difference between an electromagnetic signals intensity before and after shielding. Attenuation is measured in decibels (dB) that indicate the ratio between field strength as a result of the protective tape. For example, an elastomeric tape (828SU) having an uncalendered conductive taffeta fabric layer having silver as conductive material may have EMI shielding attenuation of between 60 to 80 dB. An elastomeric tape (828SC) having a calendered conductive taffeta fabric layer having silver as conductive material may have EMI shielding attenuation of between 58-80 dB. An elastomeric tape (828NU) having an uncalendered conductive taffeta fabric layer having nickel silver as conductive material may have EMI shielding attenuation of between 65 to 79 dB. An elastomeric tape (828NC) having a conductive layer that is produced by silvering a taffeta, subsequently nickel plating the silvered taffeta, and finally calendering the nickel plated silvered taffeta, may have EMI shielding attenuation of between 65 to 80 dB. An elastomeric tape (828SCN) having a conductive layer that is produced by silvering a taffeta, calendering the silvered taffeta, and finally nickel plating the calendered silvered taffeta, may have EMI shielding attenuation of between 62 to 83 dB. Comparatively, a conventional single layer NiAg elastomeric tape has a smaller attenuation of between 55-70 dB.

Figure 7:
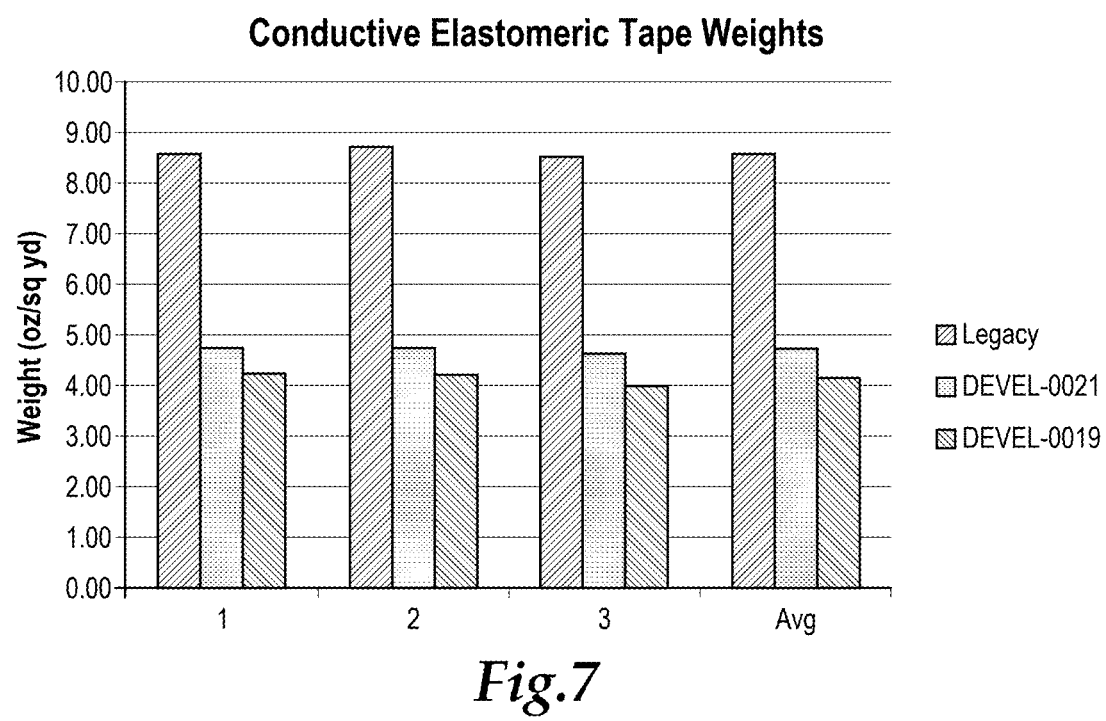
FIG. 7 shows product data of weights of multiple embodiments of conductive elastomeric tapes as compared with conventional elastomeric tape.

FIG. 7 discloses the measured weight of 2 types of thin conductive elastomeric tape of the present disclosure as compared with conventional "legacy" elastomeric tape. As shown, the conventional "legacy" elastomeric tape weighs between approximately 8 to 9 ounces per square yard. Comparatively, DEVEL-0021, a conductive elastomeric tape of the present disclosure, weighs between 4.5 to 4.9 ounces per square yard. Another example of the conductive elastomeric tape of the present disclosure, DEVEL-0019, weighs between 4 to 4.5 ounces per square yard. On average, the weight of the conductive elastomeric tapes as produced using the claimed process may weigh only half of that of the conventional elastomeric tapes.

Figure 8:
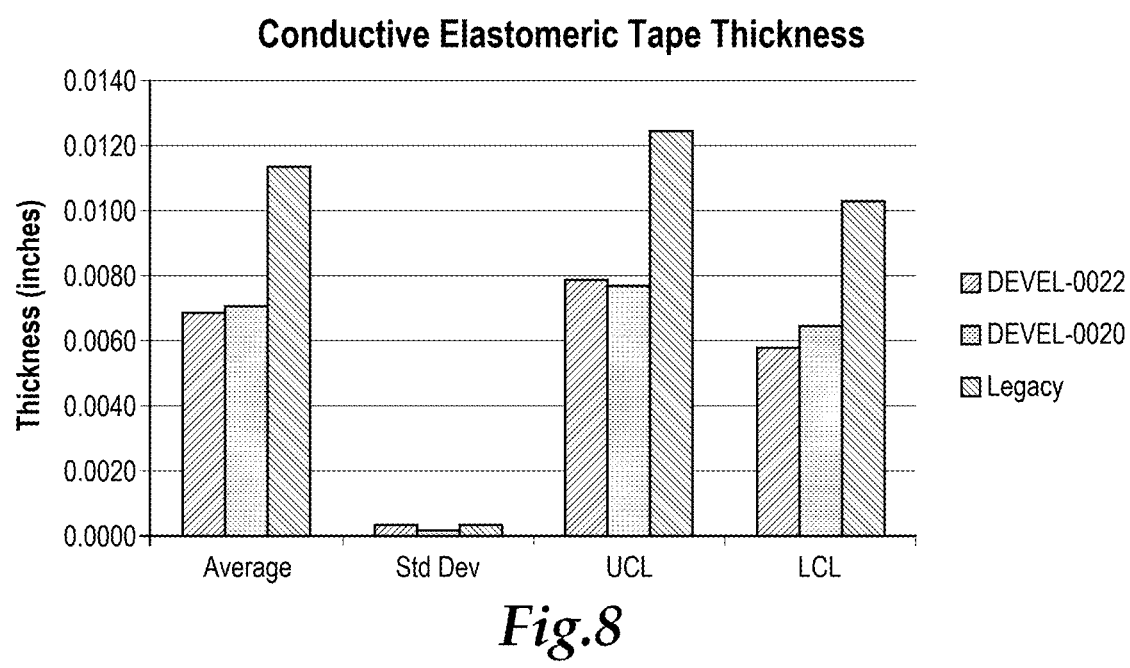
FIG. 8 shows product data of thicknesses of embodiments of conductive elastomeric tapes as compared with conventional elastomeric tape.

FIG. 8 discloses the thickness of embodiments of conductive elastomeric tapes of the present disclosure as compared with conventional "legacy" elastomeric tape using conventional manufacturing process and materials. For example, embodiments of conductive elastomeric tapes of the present disclosure, DEVEL-0022, has an average thickness of between 0.0065 to 0.0070 inches, with an upper control limit (UCL) of approximately 0.0080 inches and a lower control limit (LCL) of approximately 0.0058 inches. Another embodiment, DEVEL-0020, has an average thickness of approximately 0.0070 inches, with an UCL of approximately 0.0078 inches and a LCL of approximately between 0.0063 to 0.0070 inches. Comparatively, a legacy product has an average thickness of between 0.0110 to 0.0120 inches, with an UCL of over 0.0120 inches and a LCL of approximately 0.0100 to 0.0110 inches.

The conductive elastomeric tape of the present disclosure may be produced with various types of polymers and conductive material, as disclosed above. By varying the composition of the tape and operations of the calendering apparatus, a manufacturer may achieve different product characteristics as needed. Table 2 discloses the type and range of product characteristics that may be achieved for different embodiments of the conductive elastomeric tape of the present disclosure.

TABLE 2

| Product Characteristic | Lower End of Expected Range | Upper End of Expected Range |
| --- | --- | --- |
| Shielding Attenuation from 1 KHz to 100 GHz | 0 decibels | 120 decibels |
| Conductive Layer Surface Resistance | 0.001 Ohms/square | 5 Ohms/square |
| Elastomeric Tape Thickness | 0.001 inches | 0.010 inches |
| Elastomeric Tape Weight | 2.00 ounces/square yard | 8.00 ounces/square yard |

While the conductive elastomeric tape has been described for use for aircraft for application, it will be appreciated that the application of the disclosed elastomeric tape is not so limited. For example, the products disclosed in FIG. 1 and manufactured by the apparatus shown in FIG. 2 and method in FIG. 3 may also be used as elastomeric tapes that may be attached to any surface as appropriate. In addition, a protective liner may be disposed below the adhesive layer so that the conductive elastomeric tape may more easily be transported.

The breadth and scope of the present disclosure should not be limited by any of the above-described exemplary embodiments, but should be defined only in accordance with the following claims and their equivalents. Moreover, the above advantages and features are provided in described embodiments, but shall not limit the application of the claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Further, a description of a technology in the "Background" is not to be construed as an admission that technology is prior art to any invention(s) in this disclosure. Neither is the "Brief Summary" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

We claim:

1. A conductive elastomeric tape, comprising:
   a calendered conductive material layer comprising a top surface and a bottom surface, wherein the calendered conductive material layer was processed through a calender apparatus while applying pressure and heat;
   a polymer protective layer coating both the top surface and the bottom surface of the calendered conductive material, the polymer protective layer comprising a filling material selected from the group consisting of graphene, reduced graphene oxide, graphite, silver coated graphite, nickel coated graphite, copper coated graphite, gold coated graphite, magnetically permeable materials, ferrites, iron powder, copper powder, nickel powder and silver powder; and
   an adhesive layer coupled to a portion of the polymer protective layer,
   wherein the total thickness of a combined calendered conductive material layer and the polymer protective layer ranges from 0.004 inches to 0.008 inches,
   wherein the calendered conductive material layer comprises a first material layer being a woven fabric and a second material layer being one or more conductive materials, and
   wherein the calendered conductive material layer provides shielding of electromagnetic waves having a frequency between 1 KHz to 100 GHz at an attenuation of 0 to 120 dB.

2. The conductive elastomeric tape of claim 1, wherein the polymer protective layer is made from a material selected from the group consisting of thermoplastic, thermoset, thermoplastic elastomer, elastomer or ionomer.

3. The conductive elastomeric tape of claim 1, wherein the polymer protective layer is made from a material selected from the group consisting of epoxies, RTV silicone, peroxide cured silicone, platinum cured silicone, thermoset polyurethane, UV cured polyurethane, thermoplastic polyurethane, polypropylene, polyethylene, nylon 6, nylon 66, ethylene (meth)acrylic acid or polyamides.

4. The conductive elastomeric tape of claim 1, wherein the filling material is conductive.

5. The conductive elastomeric tape of claim 1, wherein the filling material has a morphology selected from the group consisting of rod, flake, and sphere.

6. The conductive elastomeric tape of claim 1, wherein the calendered conductive material layer includes a base material that is selected from the group consisting of elastomers, thermoplastic polymers, cellulose fiber, carbon, fiberglass, composites, thermoset polymers or basalt.

7. The conductive elastomeric tape of claim 6, wherein the second material layer includes a conductive material that is selected from the group consisting of intrinsically conductive polymers, metals, carbon or metal oxides.

8. The conductive elastomeric tape of claim 1, wherein the conductive elastomeric tape weighs between 2.5 to 5 ounces per square yard.

9. The conductive elastomeric tape of claim 1, wherein the conductive elastomeric tape has a thickness of between 0.005 to 0.008 inches.

10. The conductive elastomer tape of claim 1, wherein the calendered conductive material layer includes silver and has an electrical resistance of between 0.001 to 0.1 ohms per square.

11. The conductive elastomer tape of claim 1, wherein the calendered conductive material layer includes nickel silver and has an electrical resistance of between 0.001 to 0.1 ohms per square.

12. The conductive elastomer tape of claim 1, wherein the calendered conductive material layer provides shielding of electromagnetic waves having frequency between 1 KHz to 100 GHz at an attenuation of 55 to 90 dB.

13. The conductive elastomer tape of claim 1, wherein the calender apparatus includes at least two calender rollers, an unwind roller, a rewind roller, and a control mechanism that controls the operation of the at least two calender rollers, the unwind roller, and the rewind roller.

14. A conductive elastomeric tape, comprising:
a calendered conductive material layer comprising a top surface and a bottom surface, wherein the calendered conductive material layer was processed through a calender apparatus while applying pressure and heat;
a polymer protective layer coating both the top surface and the bottom surface of the calendered conductive material, the polymer protective layer comprising a filling material selected from the group consisting of graphene, reduced graphene oxide, graphite, silver coated graphite, nickel coated graphite, copper coated graphite, gold coated graphite, magnetically permeable materials, ferrites, iron powder, copper powder, nickel powder and silver powder; and
an adhesive layer coupled to a portion of the polymer protective layer,
wherein the total thickness of a combined calendered conductive material layer and the polymer protective layer ranges from 0.004 inches to 0.008 inches,
wherein the calendered conductive material layer comprises a first material layer being a woven fabric and a second material layer being one or more conductive materials;
wherein the calendered conductive material layer provides shielding of electromagnetic waves having a frequency between 1 KHz to 100 GHz at an attenuation of 0 to 120 dB, and
wherein the conductive elastomeric tape weighs between 2 to 8 ounces per square yard.

15. The conductive elastomeric tape of claim 14, wherein a thickness of the adhesive layer is between 0.001 to 0.003 inches.

16. The conductive elastomeric tape of claim 14, wherein the conductive elastomeric tape weighs between 3.5 to 5 ounces per square yard.

17. The conductive elastomeric tape of claim 14, wherein the conductive elastomeric tape provides shielding attenuation of between 55 to 85 dB.

18. The conductive elastomeric tape of claim 14, wherein the conductive elastomeric tape provides shielding attenuation of between 55 to 85 dB from electromagnetic waves of between 1 KHz to 100 GHz.

19. The conductive elastomeric tape of claim 14, wherein the conductive elastomeric tape has an electrical resistance of between 0.001 to 5 ohms per square.

20. The conductive elastomeric tape of claim 14, wherein the conductive elastomeric tape has an electrical resistance of between 0.01 to 1 ohms per square.

21. The conductive elastomeric tape of claim 14, wherein the polymer protective layer is made from a material selected from the group consisting of thermoplastic, thermoset, thermoplastic elastomer, elastomer, or ionomer.

22. The conductive elastomeric tape of claim 14, wherein the polymer protective layer is made from a material selected from the group consisting of epoxies, RTV silicone, peroxide cured silicone, platinum cured silicone, thermoset polyurethane, UV cured polyurethane, thermoplastic polyurethane, polypropylene, polyethylene, nylon 6, nylon 66, ethylene (meth)acrylic acid or polyamides.

23. The conductive elastomeric tape of claim 14, wherein the calendered conductive material layer includes a base material that is selected from the group consisting of elastomers, thermoplastic polymers, cellulose fiber, carbon, fiberglass, composites, thermoset polymers or basalt.

24. The conductive elastomeric tape of claim 14, wherein the second material layer includes a conductive material that is selected from the group consisting of intrinsically conductive polymers, metals, carbon or metal oxides.

* * * * *